United States Patent
Shen et al.

(10) Patent No.: US 10,074,642 B2
(45) Date of Patent: Sep. 11, 2018

(54) CROWBAR DEVICE FOR VOLTAGE TRANSIENT CIRCUIT PROTECTION

(71) Applicant: LITTELFUSE, INC., Chicago, IL (US)

(72) Inventors: Ader Shen, Chicago, IL (US); Ethan Kuo, Chicago, IL (US); Ting-Fung Chang, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 600 days.

(21) Appl. No.: 14/407,264

(22) PCT Filed: Jul. 3, 2013

(86) PCT No.: PCT/US2013/049351
§ 371 (c)(1),
(2) Date: Dec. 11, 2014

(87) PCT Pub. No.: WO2014/008415
PCT Pub. Date: Jan. 9, 2014

(65) Prior Publication Data
US 2015/0116873 A1    Apr. 30, 2015

Related U.S. Application Data

(60) Provisional application No. 61/668,326, filed on Jul. 5, 2012.

(51) Int. Cl.
*H01L 27/02* (2006.01)
*H02H 9/04* (2006.01)
*H02H 9/00* (2006.01)

(52) U.S. Cl.
CPC ...... *H01L 27/0248* (2013.01); *H01L 27/0255* (2013.01); *H01L 27/0262* (2013.01); *H02H 9/005* (2013.01); *H02H 9/04* (2013.01); *H02H 9/043* (2013.01); *H02H 9/044* (2013.01)

(58) Field of Classification Search
CPC . H01L 27/0248; H01L 27/248; H01L 27/255; H01L 27/262; H02H 9/04–9/044
See application file for complete search history.

(56) References Cited

U.S. PATENT DOCUMENTS 3,697,827 A * 10/1972 Simon ............ H01L 21/00
148/DIG. 106
4,282,555 A *  8/1981 Svedberg ........ H01L 23/492
257/146
4,291,319 A *  9/1981 Carinalli ........ H01L 27/0248
257/546

(Continued)

FOREIGN PATENT DOCUMENTS

CN    1051643 C    4/2000
CN    101512685 A    8/2009
(Continued)

*Primary Examiner* — Ronald W Leja
*Assistant Examiner* — Christopher Clark

(57) ABSTRACT

A circuit protection component including a crowbar device for protecting electronic devices from transients is generally disclosed. The circuit protection component may include a steering diode bridge and a crowbar device electrically connected to the steering diode bridge. The crowbar device may have a base and an emitter formed on a first layer, the first layer defining a breakdown voltage, which when exceeded allows current to pass under the emitter and out the device through a hole formed in the emitter.

20 Claims, 7 Drawing Sheets

(56) References Cited

U.S. PATENT DOCUMENTS

| | | | | |
|---|---|---|---|---|
| 4,720,734 A * | 1/1988 | Amemiya | H01L 21/28537 | 257/484 |
| 5,070,377 A * | 12/1991 | Harada | H01L 27/0727 | 257/336 |
| 5,401,984 A * | 3/1995 | Byatt | H01L 27/0814 | 257/107 |
| 5,422,777 A * | 6/1995 | Pezzani | H02H 9/04 | 361/111 |
| 5,483,086 A | 1/1996 | Ohta | | |
| 5,486,086 A | 1/1996 | Bellia et al. | | |
| 5,539,820 A * | 7/1996 | Pistilli | H02H 9/048 | 361/118 |
| 6,377,434 B1 * | 4/2002 | Martineau | H01C 1/16 | 361/106 |
| 6,448,589 B1 * | 9/2002 | Casey | H01L 29/41716 | 257/173 |
| 6,867,436 B1 * | 3/2005 | Matteson | H01L 27/0814 | 257/106 |
| 8,501,580 B2 * | 8/2013 | Hu | H01L 21/761 | 438/424 |
| 9,166,037 B2 * | 10/2015 | Lin | H01L 27/0259 | |
| 2002/0177324 A1 | 11/2002 | Metzler | | |
| 2007/0086137 A1 | 4/2007 | Casey | | |
| 2009/0057717 A1 * | 3/2009 | Rodrigues | H01L 27/0262 | 257/173 |
| 2011/0212595 A1 * | 9/2011 | Hu | H01L 21/761 | 438/430 |
| 2012/0007207 A1 * | 1/2012 | Salcedo | H01L 27/0259 | 257/491 |

FOREIGN PATENT DOCUMENTS

| | | |
|---|---|---|
| EP | 1453094 A1 | 9/2004 |
| JP | H05-36979 A | 2/1993 |

\* cited by examiner

CROWBAR DEVICE FOR VOLTAGE TRANSIENT CIRCUIT PROTECTION

RELATED APPLICATION

This application claims priority to U.S. provisional application Ser. No. 61/668,326 filed Jul. 5, 2012.

FIELD OF THE DISCLOSURE

This disclosure relates generally to the field of circuit protection devices and more particularly to protecting circuit components from voltage transients, such as, may be generated by lightning strikes or power circuits.

BACKGROUND OF THE DISCLOSURE

Unwanted changes in voltage or current within a circuit are generally referred to as a "transient." Transients may be caused by a variety of sources. For example, lightning strikes may cause unwanted transients within a circuit. Additionally, transients may be manifested in a variety of ways. More specifically, transients may cause a number of different changes to the steady-state voltage or current conditions within a circuit. Furthermore, the current and voltage waveforms and magnitudes associated with transients also vary. As transients often cause unwanted spikes in voltage and/or current within a circuit, damage to circuit components can occur.

Protecting circuits from transients often involves placing some type of protection component (or components) between the source of potential transients and the circuit to be protected. The protection component acts to restrict the current and voltage in the circuit to safe levels. Some protection components use semiconductor devices, due to the fact that semiconductor devices often have well defined clamping voltage and leakage current characteristics.

In practice, protection components that utilize semiconductor devices may be configured to quickly limit any voltage transients to predefined levels. The capacitance of a semiconductor junction, however, changes with voltage. As such, protecting the circuit from transients may come at the expense of increased capacitance of the protection component. Some circuits, such as, for example, very high speed subscriber telephone lines (VDSL) may experience data loss due to increased capacitance levels. Accordingly, some protection components may cause data loss within the circuit being protected due to an increase in capacitance resulting from mitigating the transient.

Furthermore, the resistance of some semiconductor devices also changes with voltage. As such, protecting the circuit from transients may also come at the expense of varying resistance, which may adversely affect the current within the circuit. Additionally, some semiconductor devices may become damaged by too many cycles of power dissipation, resulting in premature failure of the protection component.

Therefore, there is a need to for protection components that are able to quickly clamp voltage of a transient to reasonable levels, sustain repeated exposure to high currents, and not substantially change the capacitance of the circuit being protected.

SUMMARY

In accordance with the present disclosure, a circuit protection component for protecting an electronic device from a transient is provided. The circuit protection component may include a steering diode bridge and a crowbar device electrically connected to the steering diode bridge. The crowbar device may have a base and an emitter formed on a first layer, the first layer defining a breakdown voltage, which when exceeded allows current to pass under the emitter and out the device through a hole formed in the emitter.

In some embodiments, the crowbar device for the circuit protection component may include a diffusion layer formed in a lower region of a substrate, a base formed on the substrate, and an emitter having a hole therein formed on the base, the crowbar device having a breakdown voltage, which when exceeded allows current to pass under the emitter and out the device through a hole formed in the emitter.

Additional embodiments of the crowbar device may include an epitaxial layer formed on a substrate, a base formed on the epitaxial layer, and an emitter having a hole therein formed on the base, the crowbar device having a breakdown voltage, which when exceeded allows current to pass under the emitter and out the device through a hole formed in the emitter.

BRIEF DESCRIPTION OF THE DRAWINGS

By way of example, specific embodiments of the disclosed device will now be described, with reference to the accompanying drawings, in which.

DETAILED DESCRIPTION

Figure 1:
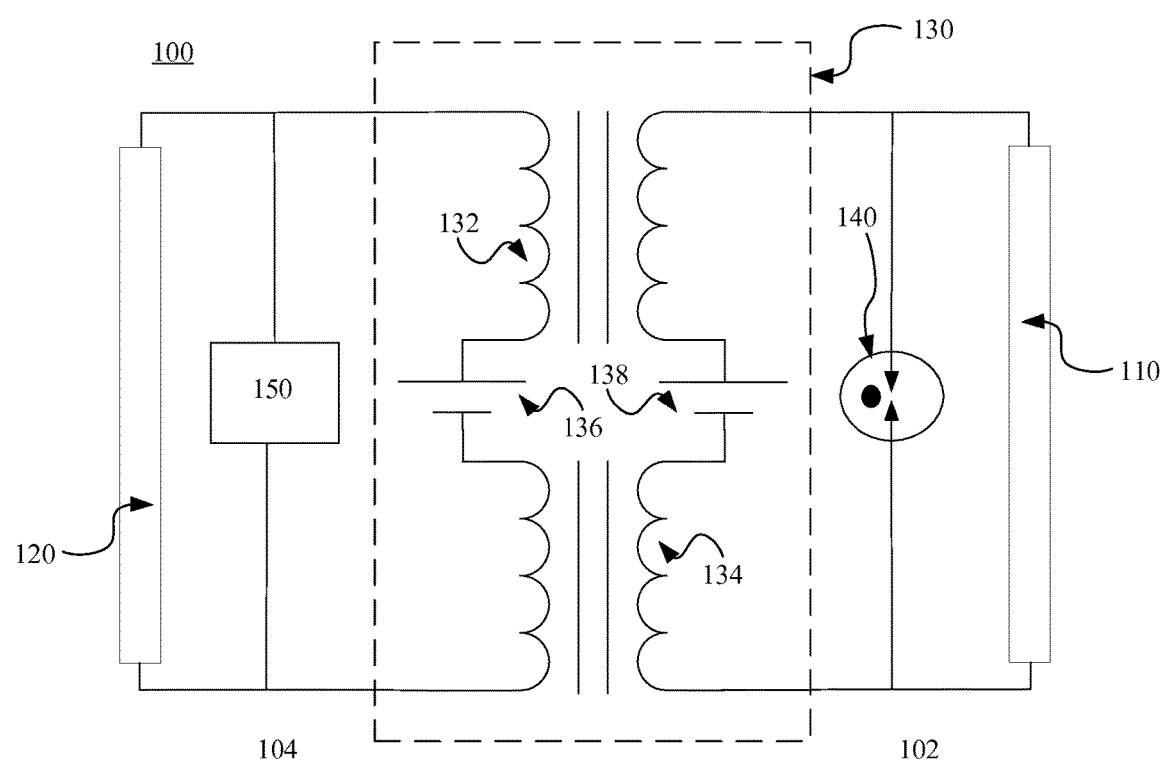
FIG. 1 is a block diagram of a circuit connecting an external transmission line to a data line.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

FIG. 1 illustrates a block diagram of an example circuit 100, arranged in accordance with various embodiments of the present disclosure. As depicted, the circuit 100 includes an external transmission line 110 and a data line 120 connected via capacitive voltage transformer circuit 130. In describing the circuit 100 below, reference may be made to the transmission line side 102 and the data line side 104. As depicted, the capacitive voltage transformer circuit 130 includes transformers 132, 134 and capacitors 136, 138. In general, the capacitive voltage transformer circuit 130 operates to filter and/or transform the voltage signals from the external transmission line 110 to the data line 120. For example, the data line 120 may be a VDSL and the external transmission line may connect the VDSL line to external locations (e.g., central transmission office, an Internet service provider, or the like.)

During operation, the external transmission line 110 may be exposed to a wide range of electrical interferences, such as, for example, lightning strikes, power cross, power induction, or the like, all of which may result in voltage transients in the transmission line side 102. In order to protect the circuit 100 from voltage transients, a circuit protection component is often connected to the transmission line side 102. For example, FIG. 1 depicts a gas discharge tube 140 connected to the external transmission line 110. In general, the gas discharge tube 140 operates to dissipate voltage transients through a plasma gas contained within the gas discharge tube 140. The gas discharge tube 140 has a maximum voltage, sometimes referred to as a "sparkover voltage." When the sparkover voltage is exceeded, the gas within the gas discharge tube 140 becomes ionized, which causes the gas discharge tube 140 to conduct current thereby diverting the transient to ground. Various standards exist for ensuring that the external transmission line 110 and related circuitry can withstand voltage transients. For example, the Telecordia GR-1089 standard lists various voltage surge conditions that external transmission lines may be tested against.

As will be appreciated, while the gas discharge tube 140 diverts any voltage transients to ground, changes to the steady state voltage and/or current within the transmission line side 102 will be communicated (via the capacitive voltage transformer circuit 130) to the data line side 104. Furthermore, transients communicated to the data line side 104 will be of much shorter duration, yet much higher current. More particularly, as the cores of the transformers 132 and 134 saturate due to the voltage transient, the current in the transformers 132 and 134 will rise. As a result, the voltage transient communicated to the data line side 104 will have a higher current than the original voltage transient on the transmission line side 102. Accordingly, voltage transients on the data line side 104 will have a different waveform and much higher current than those on the transmission line side 102. For example, a typical voltage transient on the transmission line side 102 may have a pulse width of several hundred microseconds. The voltage transient communicated to the data line side 104 may have a pulse width of less than a microsecond, yet have several hundred amps of current.

The data line side 104, then, may also include a circuit protection component 150. The circuit protection component 150 (described in greater detail below) may be configured to protect the data line side 104 from voltage transients communicated from the transmission line side 102. As stated above, semiconductor devices are often used to form the circuit protection component 150 due to their well-defined clamping voltages and low leakage currents. However, the capacitance of a semiconductor junction changes with voltage as the width of the depletion layer increases with applied voltage.

Figure 2:
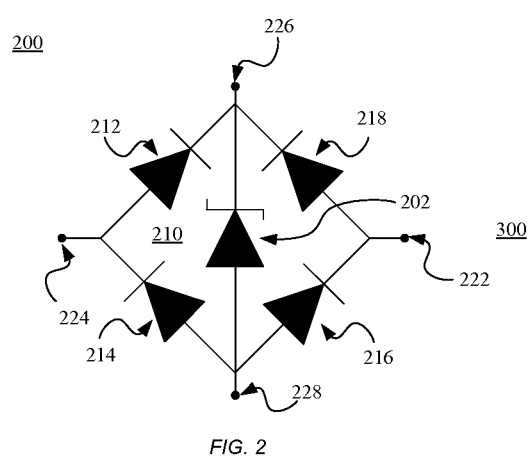
FIG. 2 is a block diagram of a conventional circuit protection component.

FIG. 2 illustrates a block diagram of a conventional circuit protection component 200. As depicted, the circuit protection component 200 includes an avalanche diode 202 connected in series with a steering diode bridge 210. The steering diode bridge 210 includes four diodes 212, 214, 216, and 218. In general, the circuit protection component 200 may be connected to a circuit to be protected via terminals 222 and 224. Furthermore, the capacitance of the circuit protection component 200 may be adjusted based on an external bias, such as, may be applied at terminals 226 and 228. Although the avalanche diode normally has high capacitance, the steering diode bridge 210 effectively lowers the capacitance of the circuit protection component 200, as the capacitance presented to the data line 120 is that of the steering diode bridge 210 rather than the avalanche diode 202. Furthermore, the capacitance of the circuit protection component 200 may be further reduced by reverse biasing the diodes 212, 214, 216 and 218.

Although the circuit protection component 200 may provide for fast voltage clamping and capacitance levels appropriate for the data line 120, the circuit protection component 200 may not be able to handle the high current levels resulting from the voltage transients described above. More specifically, resistive drops in the avalanche diode 202 may cause the voltage across the avalanche diode 202 to rise significantly above the clamping voltage, which can cause damage to components in the data line side 104. Additionally, the avalanche diode 202 may become damaged by too many cycles of power dissipation. More particularly, repetitive voltage transients (e.g., as may be caused by induced power) may damage the avalanche diode 202.

Figure 3:
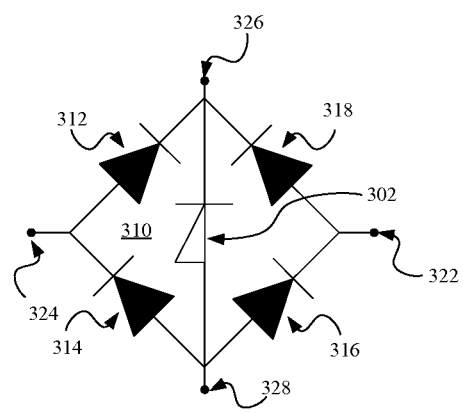
FIG. 3 is a block diagram of an example circuit protection component.

FIG. 3 illustrates a block diagram of a circuit protection component 300, arranged according to various embodiments of the present disclosure. As depicted, a crowbar device 302 is connected in series with a steering diode bridge 310. The steering diode bridge 310 includes diodes 312, 314, 316, and 318. Various examples of the crowbar device 302 are described later, particularly with relation to FIGS. 4-5. In general, the circuit protection component 300 may be configured as the circuit protection component 150 shown in FIG. 1. For example, the circuit protection component 300 may be connected to the data line 120 via terminals 322 and 324. Furthermore, the capacitance of the circuit protection component 300 may be adjusted based on an external bias, such as, may be applied at terminals 326 and 328. As such, when transients are communicated from the transmission line side 102 to the data line side 104, the circuit protection component 300, and particularly, the crowbar device 302, may suppress them.

In some examples, the diodes 312, 314, 316, and 318 may be fabricated using a high resistivity epitaxial layer (e.g., between 50 and 200 Ohm-centimeter, or the like) on a heavily doped N-type substrate. A selective anode region is diffused into the epitaxial layer to form the diode. As the epitaxial layer is of low doping, this region rapidly depletes with applied voltage. Furthermore, as will be appreciated, the capacitance of the diodes may be determined by the thickness of the epitaxial layer. In some embodiments, the thickness of the epitaxial layer may be chosen to give the diodes 312, 314, 316, and 318 desired capacitance and voltage overshoot characteristics. The low doped region between the heavily doped anode and cathode may, in some example, be approximately between 5 and 15 microns in width. In some examples, the polarity of the diode regions described above for the diodes 312, 314, 316, and 318 may be reversed.

Figure 4:
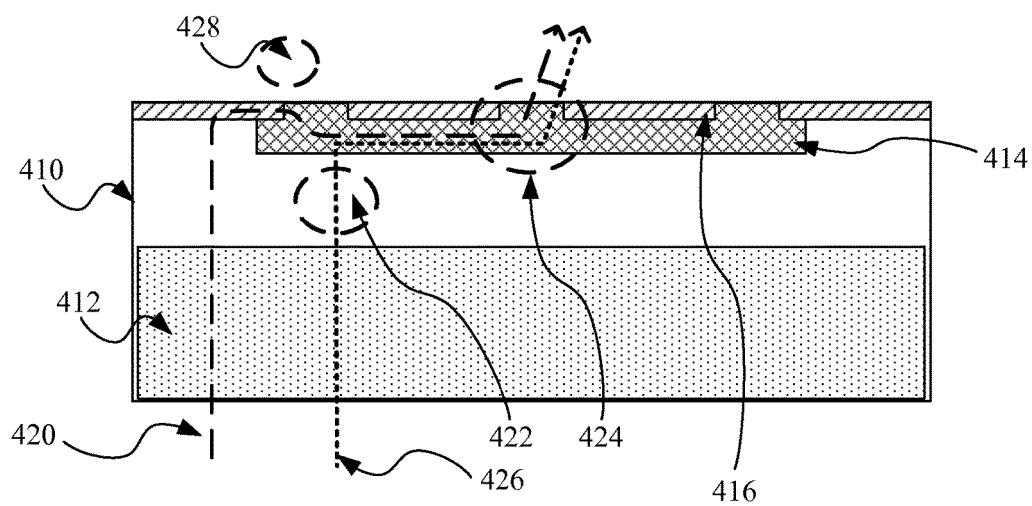
FIG. 4 is a block diagram of an example crowbar protection device.

FIG. 4 illustrates a block diagram of an example crowbar protection device 400, arranged in accordance with various embodiments of the present disclosure. In some examples, the crowbar protection device 400 may be implemented in the circuit protection component 300 as the crowbar device 302. As depicted, the crowbar protection device 400 is fabricated on a substrate 410, such as, for example, silicon. With some embodiments, the substrate 410 is an N-type substrate having a resistivity of approximately 25 Ohm-centimeter. As depicted, the substrate 410 includes a deep diffusion area 412, located near the bottom of the substrate 410. The deep diffusion area 412 forms the anode of the crowbar protection device 400. In some examples, the deep diffusion area 412 may be a P+ type diffusion area.

A base 414 and an emitter 416 are additionally depicted. In some examples, the base 414 may be a P-type base and the emitter 416 may be an N+ type emitter. The base 414 and emitter 416 may be formed into the front of the substrate 410 using conventional semiconductor manufacturing techniques, which will be apparent to those of ordinary skill in the art. As depicted, the crowbar protection device 400 is an NPNP type semiconductor devices. In some examples, the emitter 416 overlaps the edge of the base 414, to form a low voltage breakdown region. Additionally, in some examples, the crowbar protection device 400 may additionally have oxide layers and metal layers (not shown) formed on the top and/or bottom of the device to form an anode and cathode for connecting the device to a circuit (e.g., the circuit protection component 300, or the like.)

During operation, when a voltage transient appears across the crowbar protection device 400, current flows along a trigger path 420 (shown as dotted line.) Current initially flows through a portion of the emitter 416 as illustrated. Due to the high resistivity of the substrate 410, high voltage drops may be developed as current passes through the region along trigger path 420. This may be particularly true during periods of fast and/or large current transients. The current then passes through a breakdown region 422 along the path 426. The breakdown region 422 may define the triggering voltage. The trigger voltage may be selected to suit desired device characteristics, and may, in some examples, be in the range of 8-50 Volts. When the trigger voltage is exceeded, current passes under the emitter 416 (as shown) and out through the region 424, where a hole is formed in the emitter 416. With some examples, when the voltage at point 428 reaches approximately 0.7 Volts, the emitter 416 becomes forward biased and the crowbar protection device 400 begins to regenerate and enter the conducting state. In some examples, the emitter 416 may be formed having a number of holes in the region 424. However, a single hole is shown in FIG. 4 for clarity.

In some examples, the crowbar protection device 400 may be configured to protect a circuit against standard transient waveforms. However, as will be appreciated, the crowbar protection device 400 may also be subjected to other transients, such as, electrostatic discharge (ESD). The high static voltages of these other transients can rupture the oxide on the crowbar protection device 400. In some examples, protection for such transients may be provided by setting the doping level in region 424 such that the depletion layer hits the diffusion area 412 at voltages lower than that which causes oxide damage but higher than the breakdown voltage.

Figure 5A:
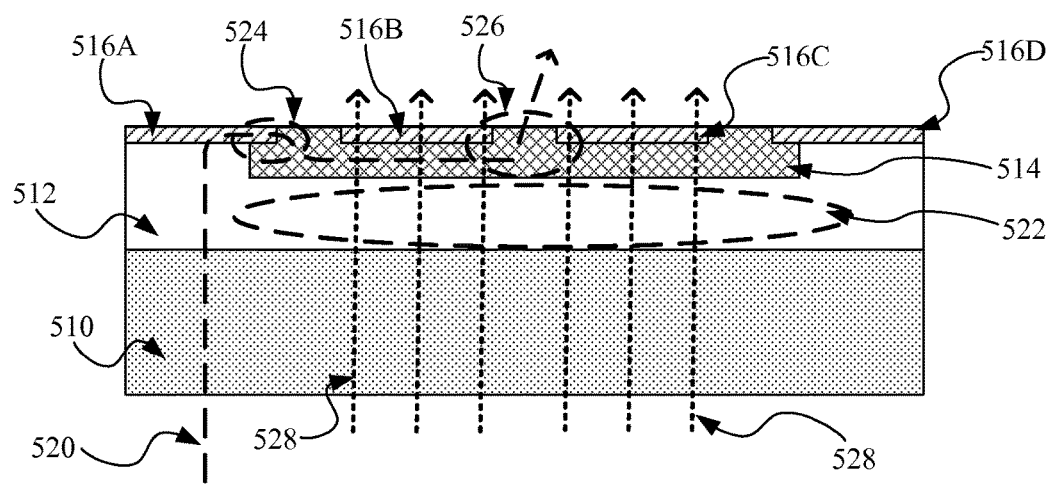
FIGS. 5A-5D are block diagrams of another example crowbar protection device.

FIG. 5A illustrates a block diagram of another example crowbar protection device 500, arranged in accordance with various embodiments of the present disclosure. In some examples, the crowbar device 500 may be implemented in the circuit protection component 300 as the crowbar device 302. As depicted, the crowbar device 500 is fabricated on a substrate 510, such as, for example, silicon. With some embodiments, the substrate 510 is a P+ type substrate. An epitaxial layer 512 has been fabricated (e.g., grown, or the like) onto the substrate 510. In some embodiments, the epitaxial layer 512 is an N-type epitaxial layer.

A base 514 and an emitter 516 are additionally depicted. The emitter 516 is depicted having portions 516A-516D. In some examples, the base 514 may be a P-type base and the emitter 516 may be an N+ type emitter. The base 514 and emitter 516 may be formed into the epitaxial layer 512 using conventional semiconductor manufacturing techniques, which will be apparent to those of ordinary skill in the art. With some examples, the substrate 510, the epitaxial layer 512, the base 514, and the emitter 516 form an NPNP type semiconductor devices. With some examples, the emitter 516 overlaps the edge of the base 514, to form a low voltage breakdown region. Additionally, in some examples, the crowbar device 500 may additionally have oxide layers and metal layers formed on the top and/or bottom of the device to form an anode and cathode for connecting the device to a circuit (e.g., the circuit protection component 300, or the like.)

With some embodiments, the epitaxial layer 512 may be doped between the substrate 510 and the base 514 (e.g., as highlighted by region 522.) The doping characteristics of region 522 may be selected to give the crowbar device 500 desired switching characteristics. In general, the concentration of dopants near the emitter 516A to base 514 junction (e.g., highlighted by region 524) may be greater than that of the region 522. It is to be appreciated, that the doping described above with respect to region 522 may be selected to give the region 524 a higher breakdown voltage than the region 522. Furthermore, it is to be appreciated, however, that other techniques to increase the breakdown voltage of region 522 may be implemented without departing from the spirit and scope of the disclosure.

During operation, when a voltage transient appears across the crowbar device 500, current flows along a trigger path 520 (shown as dotted line.) Current initially flows through the emitter 516A and through the base 514 and under emitter 516B and out through region 526, where a hole in the emitter 516 is formed. In some examples, the emitter 516 may be formed having a number of holes in the region 526. However, a single hole is shown in FIG. 5 for clarity. The breakdown voltage (also referred to as trigger voltage) may be selected to suit desired device characteristics, and may, in some examples, be in the range of 8-50 Volts. When the breakdown voltage of region 524 is exceeded, current begins to flow along path 528. In some examples, the concentration of dopants in region 522 may be greater than that of other regions within the epitaxial layer 512. Furthermore, the concentration of dopants in region 522 may be selected to facilitate a uniform conduction of current along path 528.

Figure 5B:
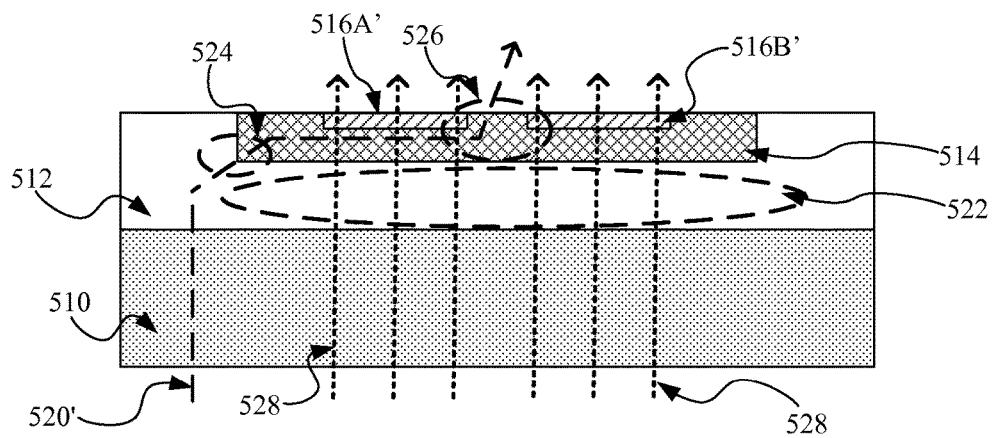

FIG. 5B illustrates a block diagram of another an example crowbar protection device 500'. As can be seen, the device 500' is similar to the device 500. More particularly, the device 500' includes the substrate 510, the epitaxial layer 512, and the base 514 as described above with respect to FIG. 5A and the device 500. The device 500' includes an emitter 516'. As depicted, the emitter 516' includes portions 516A' and 516B' formed above the base 514. The emitter 516' further includes a hole in region 526, similar to that described above with respect to FIG. 5A.

During operation, when a voltage transient appears across the crowbar device 500', current flows along trigger path 520' (shown as dotted line.) As depicted, current initially flows through the epitaxial layer 512 to the junction between the base 514 and the epitaxial layer 512 (e.g., region 524), and then through the base 514 under emitter 516A' and out through region 526. In some examples, the emitter 516 may be formed having a number of holes in the region 526. However, a single hole is shown in FIG. 5 for clarity. As described above with respect to the device 500 and FIG. 5A, when the breakdown voltage of region 524 is exceeded, current begins to flow along path 528. In some examples, the concentration of dopants in region 522 may be greater than that of other regions within the epitaxial layer 512. Furthermore, the concentration of dopants in region 522 may be selected to facilitate a uniform conduction of current along path 528.

Figure 5C:
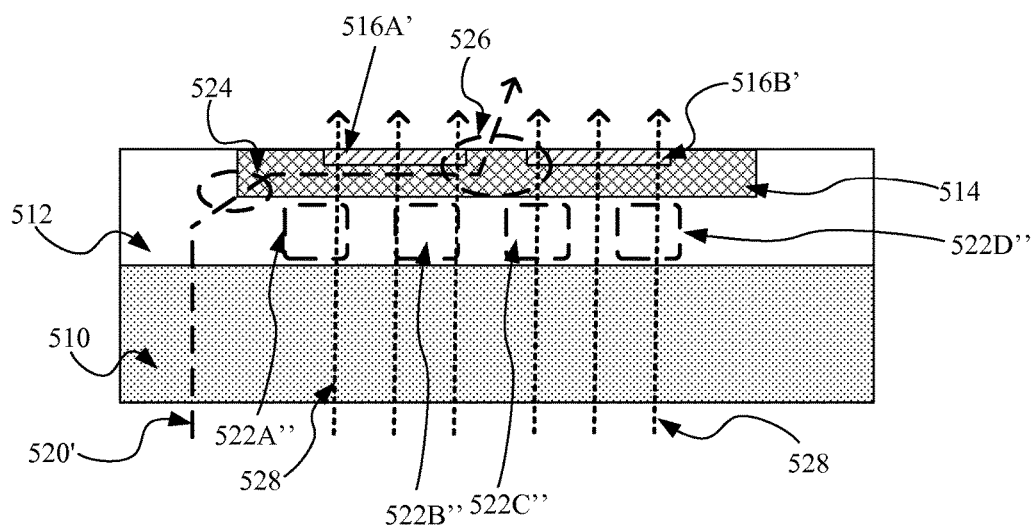

FIG. 5C illustrates a block diagram of another an example crowbar protection device 500". As can be seen, the device 500" is similar to the device 500' described above. More particularly, the device 500" includes the substrate 510, the epitaxial layer 512, the base 514 and the emitter 516' as described above with respect to FIG. 5B. In some examples, the diffusion region 522' of the epitaxial layer 512 below the base may have multiple diffusion regions. For example, the device 500" is shown having diffusion regions 522A"-522D". The diffusion level of the regions 522A"-522D" may be selected to provide the device 500" with the desired breakdown voltage between the base 514 and region 522" such that the breakdown voltage of this region is higher than that of the breakdown voltage defined by the junctions between the epitaxial layer 512 and the corner of the base 514 (e.g., region 524). The operation of the device 500" is similar to that as described above with respect to the device 500'. More particularly, the initial current path 520' is shown flowing through the region 524. After voltage breakdown, the current will flow though the path 528.

Figure 5D:
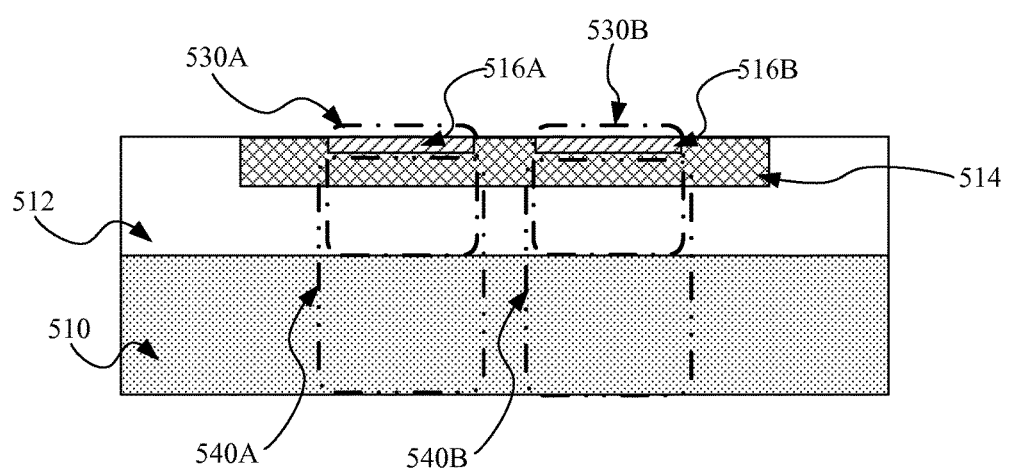

FIG. 5D illustrates a block diagram of another an example crowbar protection device 500'''. As depicted, the crowbar device 500''' includes the substrate 510, the epitaxial layer 512, the base 514 and the emitter portions 516A and 516B. In some examples, the substrate 510 and the base 514 may be formed from P-type (e.g., P or P+) materials. In some examples, the epitaxial layer 512 and the emitter 516 may be formed from N-type (e.g., N or N+) materials. Additionally, although not shown, the epitaxial layer 514 may be doped (e.g., as at region 522 shown in FIGS. 5A-5C.)

NPN and PNP junctions that are formed between the layers 510, 512, 514, and 516 of the crowbar protection device 500''' are shown. As will be appreciated, the illustrated NPN and PNP junctions are also present (although not illustrated for clarity) in the crowbar protection devices 500, 500', and 500". As depicted, NPN junctions 530A and 530B are shown being formed from the emitter 516A, 516B, the base 514, and the epitaxial layer 512. Additionally, PNP junctions 540A and 540B are shown being formed from the base 514, the epitaxial layer 512 and the substrate 510. As described above with respect to FIGS. 5A-5B, when the voltage drop across current path 520 exceeds the breakdown voltage (e.g., 0.7 Volts), the NPN junctions 530A, 530B and the PNP junctions 540A, 540B being to regenerate, which causes the crowbar protection device 500''' to fully turn on and conduct along the conduction path 528.

Figure 6:
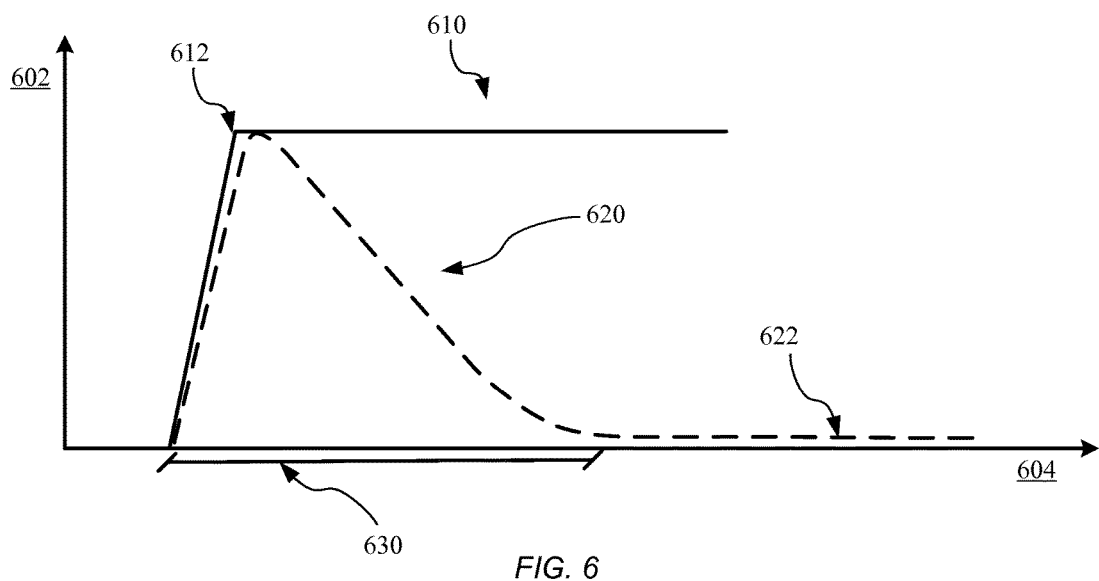
FIG. 6 is a block diagram of an example voltage response of a crowbar protection device.

FIG. 6 illustrates a block diagram of an example voltage transient waveform 610 (solid line) and corresponding example voltage response waveform 620 (dashed line) of a crowbar device, arranged in accordance with various embodiments of the present disclosure. In some examples, either of the crowbar devices 400 and/or 500 may have a voltage response substantially similar to that depicted in FIG. 6. As depicted, the block diagram defines the transient waveform 610 and voltage response waveform 620 by voltage magnitude, represented on the y-axis 602 and a voltage pulse duration, represented on the x-axis 604. The voltage transient waveform 610 quickly increases in magnitude until the trigger point 612 (e.g., the voltage breakdown point of the crowbar device) is reached. As detailed above, due to the fact the crowbar device present a high resistance area to the current path, the voltage across the crowbar device will also increases in magnitude to the trigger point, similar to the transient response. As the crowbar device breaks down and enters the conducting state, the voltage across the crowbar falls to a small, steady state level 622 in time period 630. In some examples, the time period 630 may be 0.5 microseconds, or less. More specifically, various crowbar devices according to the present disclosure, such as, the crowbar devices 400 and 500, may have a voltage response similar to the voltage response waveform 620 with a corresponding time period 630 that is less than 0.5 microseconds. Conversely, conventional crowbar devices have voltage responses with substantially greater time periods, such as, for example, 1 microsecond or greater. As detailed above, voltage responses of a microsecond or greater may be insufficient to adequately protect the data line 120 from damage.

Figure 7:
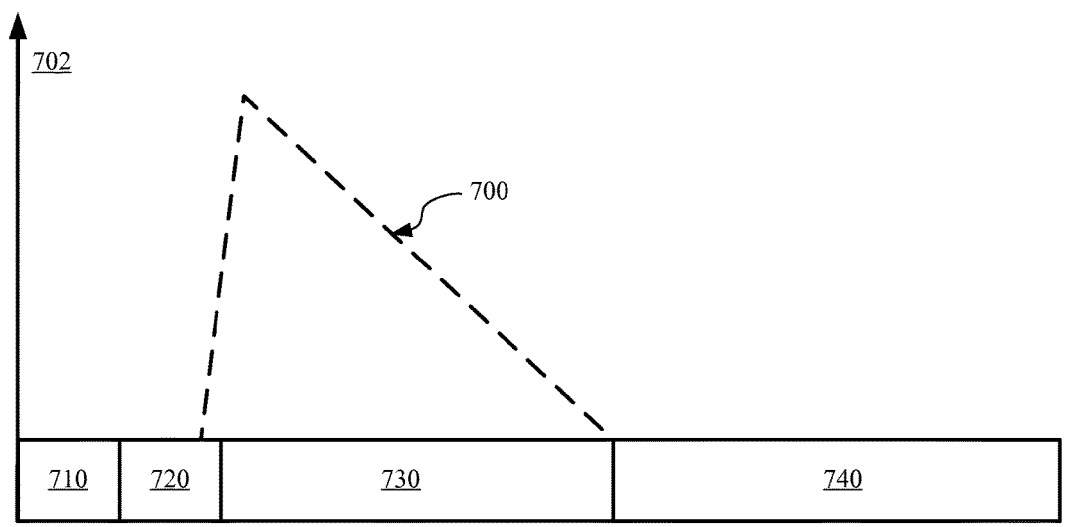
FIGS. 7-9 are block diagrams of example doping profiles of a crowbar protection device, all arranged in accordance with at least some embodiments of the present disclosure.

FIG. 7 illustrates a block diagram of an example doping profile of a crowbar device having a corresponding electric field distribution 700 (dotted line). The magnitude of the electric field is shown on the y-axis 702. As depicted, the crowbar device has four layers, 710, 720, 730, and 740. In some examples, the crowbar device may be an NPNP crowbar device, such as, the crowbar devices 400 and 500 described above. Furthermore, the layers 710 and 730 may be N and N+ type layers respectively, while the layers 720 and 740 may be P and P+ type layers respectively. As depicted, the epitaxial doping is uniform between layers 720 and 740. The doping concentration and width may be selected such that region between layers 720 and 740 (e.g., regions 424 and 522 depicted above) is fully depleted at the required trigger voltage. As an example, the resistivity the region between layers 720 and 740 may be approximately 1.0 Ohm-centimeter and have a thickness of approximately 2 microns to have a trigger voltage of about 20 Volts. More specifically, the region may be fully depleted when the applied voltage reaches about 20 Volts. As depicted, once the region is fully depleted, the electric field at the junction between layers 730 and 740 is heavily forward biased and the crowbar device may rapidly being to conduct.

As will be appreciated by those of ordinary skill in the art, the switching speed of a transistor may be inversely proportional to the square of the transistor's base width. In some embodiments, this width (e.g., the width of the substrate 410 or the width of the epitaxial layer 512) may be between 50 and 100 microns. Thus, the switching speed may be substantially reduced as compared to conventional crowbar devices, making the crowbar devices now suitable for transient protection and particularly to transient protection of VDSL devices. Additionally, as will be appreciated, the reverse bias used to moderate the capacitance variation of the steering diode bridge (e.g., 310) will exist across the crowbar device. This will effectively reduce the base width of the transistor, further improving the switching speed.

Figure 8:
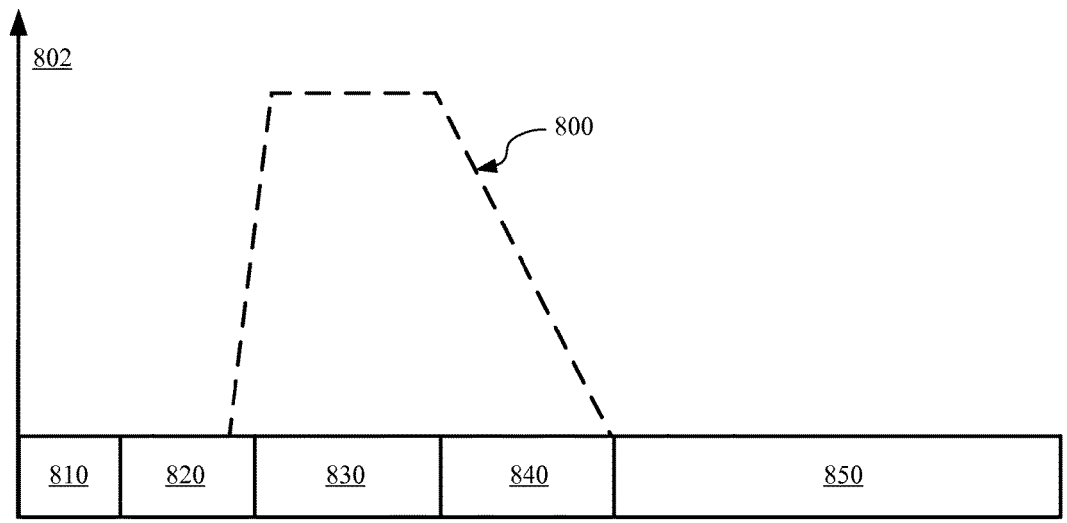

If a requirement is to maximize the switching speed of the crowbar device, the doping profile may be adjusted so that the main volume of the region (e.g., the region 424 or 522) is depleted at low bias voltages to give the narrowest base width over the full range of bias conditions. This is more fully illustrated in FIG. 8, which depicts a block diagram of an example doping profile of a crowbar device having a corresponding electric field distribution 800 (dotted line). The magnitude of the electric field is shown on the y-axis 802. As depicted, the crowbar device has five layers, 810, 820, 830, 840, and 850. In some examples, the crowbar device may be an NPNP crowbar device, such as, the crowbar devices 400 and 500 described above. Furthermore, the layers 810, 830, and 840 may be N+, N, and N+ type layers respectively, while the layers 820 and 840 may be P and P+ type layers respectively.

As depicted, the layer 830 is very lightly doped, so that it will be depleted at low bias voltages by the adjacent adjoining layer 840, thus preventing the layer 850 from being depleted. As the corresponding electric field distribution 800 is more rectangular, a narrower region (e.g., the regions 424 or 522) may be required to provide for a desired trigger voltage, which may in turn further enhance the switching speed as well as provide lower capacitance.

Figure 9:
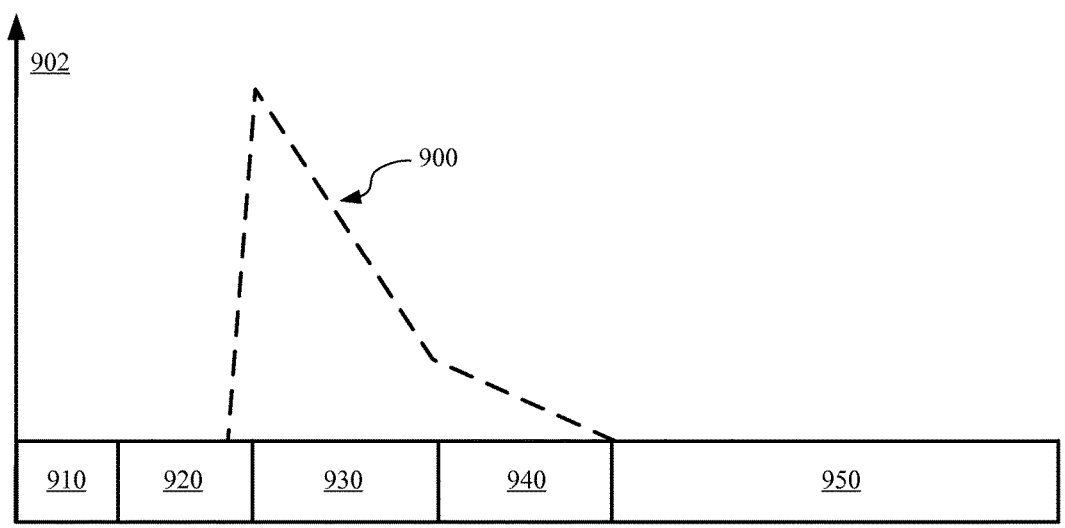

FIG. 9 illustrates a block diagram of an example doping profile of a crowbar device having a corresponding electric field distribution 900 (dotted line). The magnitude of the electric field is shown on the y-axis 902. As depicted, the crowbar device has five layers, 910, 920, 930, 940, and 950. In some examples, the crowbar device may be an NPNP crowbar device, such as, the crowbar devices 400 and 500 described above. Furthermore the layers 910, 930, and 940 may be N+, N+, and N type layers respectively, while the layers 820 and 840 may be P and P+ type layers respectively.

As depicted, a higher doping of the layer 930 near the layer 920 is evident by the electric field distribution 900. More particularly, the depletion layer is constrained in the region of the junction between layers 920 and 930 until the layer 930 is fully depleted. Once the layer 930 is fully depleted, the lightly doped region rapidly depletes and junction between layers 940 and 950 becomes heavily forward biased. An advantage of using this doping profile is that the transistor gain may be keep relatively low and constant. This may allow problems like excessive leakage current at the expense of switching speed to be negated.

The invention claimed is:

1. A circuit protection component comprising:
a steering diode bridge; and
a crowbar device electrically connected to the steering diode bridge, the crowbar device including a substrate, an epitaxial layer, a base, and an emitter;
wherein the epitaxial layer is formed over the substrate, the emitter including at least a first portion and a second portion formed within the base, and the base being formed over the epitaxial layer;
wherein a concentration of dopants in a central region of the epitaxial layer is greater than a concentration of dopants in a peripheral region of the epitaxial layer;
wherein a junction between the peripheral region of the epitaxial layer and the base defines a breakdown voltage;
wherein current is flowable from the substrate, through the peripheral region of the epitaxial layer, through the base, and under the first portion of the emitter to the hole formed in the emitter when the breakdown voltage is not exceeded; and
wherein current is flowable from the substrate, through the central region of the epitaxial layer, through the base, and through the first portion and the second portion of the emitter when the breakdown voltage is exceeded.

2. The circuit protection component of claim 1, further comprising a first terminal and a second terminal, the first and second terminal configured to connect the circuit protection component to a circuit to be protected.

3. The circuit protection component of claim 2, wherein the steering diode bridge includes a first diode, a second diode, a third diode, and a fourth diode.

4. The circuit protection component of claim 3, wherein the first terminal is electrically connected to the anode of the first diode and the cathode of the second diode, the cathode of the first diode is electrically connected to the cathode of the third diode, the anode of the second diode is electrically connected to the anode of the fourth diode, and the second terminal is electrically connected to the anode of the third diode and the cathode of the fourth diode.

5. The circuit protection component of claim 4, wherein the anode of the crowbar device is electrically connected to the anode of the second and fourth diodes, and the cathode of the crowbar device is electrically connected to the cathode of the first and third diodes.

6. The circuit protection component of claim 1, wherein the steering diode bridge includes a plurality of diodes, the plurality of diodes being formed from a high resistivity epitaxial layer on an N-type substrate, wherein the high resistivity epitaxial layer has a resistivity of greater than or equal to 50 Ohm-centimeter.

7. The circuit protection component of claim 6, wherein the N-type substrate is heavily doped relative to the doping of the high resistivity epitaxial layer.

8. The circuit protection component of claim 7, wherein the epitaxial layer is between 5 and 15 microns thick.

9. A crowbar device for a circuit protection component comprising:
a substrate, the substrate having a breakdown region;
a diffusion layer formed in a lower region of the substrate;
a base formed on the substrate; and
an emitter having a hole therein formed on the base, the crowbar device having a breakdown voltage defined by the breakdown region;
wherein when the breakdown voltage is not exceeded, current is flowable from the diffusion layer, through the substrate, through a portion of the emitter, through the base, and out the device through a hole formed in the emitter; and
wherein when the breakdown voltage is exceeded, current is flowable from the diffusion layer, through the breakdown region of the substrate, and through the base and out the device through the hole formed in the emitter without traversing through the emitter.

10. The crowbar device of claim 9, wherein the substrate has a resistivity of approximately 25 Ohm-centimeter.

11. The crowbar device of claim 9, wherein the substrate is an N-type substrate.

12. The crowbar device of claim 9, wherein the diffusion layer is formed by doping the lower region of the substrate to form a P+-type diffusion region.

13. The crowbar device of claim 9, wherein the base is a P-type semiconductor.

14. The crowbar device of claim 9, wherein the emitter is an N-type semiconductor.

15. The crowbar device of claim 9, wherein the breakdown voltage is between 8 and 50 Volts.

16. A crowbar device for a circuit protection component comprising:
a substrate;
an epitaxial layer formed on the substrate, wherein the epitaxial layer includes a first region having a breakdown voltage and a higher concentration of dopants than a second region;
a base formed on the epitaxial layer; and
an emitter having a hole therein formed on the base, which prior to the breakdown voltage being exceeded allows current to pass under the emitter and out the device through the hole formed in the emitter and when exceeded allows current to pass through the first region of the epitaxial layer, through the base and then through the emitter.

17. The crowbar device of claim 16, wherein the base is a P-type semiconductor.

18. The crowbar device of claim 16, wherein the emitter is an N+-type semiconductor.

19. The crowbar device of claim 16, wherein the substrate is a P-type semiconductor.

20. The crowbar device of claim 16, wherein the breakdown voltage is between 8 and 50 Volts.

* * * * *